(12) United States Patent
Sung et al.

(10) Patent No.: US 9,177,843 B2
(45) Date of Patent: Nov. 3, 2015

(54) PREVENTING CONTAMINATION IN INTEGRATED CIRCUIT MANUFACTURING LINES

(75) Inventors: Chien-Ming Sung, Tainan (TW); Simon Wang, Tainan (TW); Jia-Ren Chen, Tainan (TW); Henry Lo, Hsin-Chu (TW); Chen-Hua Yu, Hsin-Chu (TW); Jean Wang, Hsin-Chu (TW); Kewei Zuo, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 711 days.

(21) Appl. No.: 11/771,734

(22) Filed: Jun. 29, 2007

(65) Prior Publication Data

US 2008/0304944 A1 Dec. 11, 2008

Related U.S. Application Data

(60) Provisional application No. 60/933,344, filed on Jun. 6, 2007.

(51) Int. Cl.
*H01L 21/677* (2006.01)
*H01L 21/673* (2006.01)
*H01L 21/67* (2006.01)

(52) U.S. Cl.
CPC .... *H01L 21/67393* (2013.01); *H01L 21/67017* (2013.01); *H01L 21/67161* (2013.01); *H01L 21/67703* (2013.01); *Y10S 414/139* (2013.01)

(58) Field of Classification Search
CPC ...................... H01L 21/67703; H01L 21/6779
See application file for complete search history.

(56) References Cited

U.S. PATENT DOCUMENTS

| | | | | |
|---|---|---|---|---|
| 4,676,144 A * | 6/1987 | Smith, III | ...................... | 454/187 |
| 4,682,927 A * | 7/1987 | Southworth et al. | .......... | 414/217 |
| 5,303,482 A | 4/1994 | Yamashita et al. | | |
| 5,344,365 A * | 9/1994 | Scott et al. | ..................... | 454/187 |
| 5,363,867 A * | 11/1994 | Kawano et al. | .............. | 134/95.2 |
| 5,562,383 A * | 10/1996 | Iwai et al. | .................. | 414/217.1 |
| 5,628,828 A * | 5/1997 | Kawamura et al. | ........... | 118/719 |
| 5,713,791 A * | 2/1998 | Long et al. | ..................... | 454/187 |
| 6,158,946 A * | 12/2000 | Miyashita | ..................... | 414/411 |
| 6,343,239 B1 * | 1/2002 | Toda et al. | ..................... | 700/121 |
| 6,467,976 B2 * | 10/2002 | Matsuyama et al. | .......... | 396/611 |
| 6,503,379 B1 * | 1/2003 | Kidd et al. | ..................... | 414/217 |
| 6,660,597 B2 * | 12/2003 | Furukawa et al. | ............ | 438/287 |
| 6,679,672 B1 * | 1/2004 | Barrows | ........................ | 414/217 |
| 6,701,972 B2 * | 3/2004 | Dickinson et al. | ......... | 414/217.1 |
| 6,817,822 B2 * | 11/2004 | Tokunaga | ..................... | 414/217 |
| 6,828,235 B2 * | 12/2004 | Takano | ......................... | 438/680 |
| 6,949,143 B1 * | 9/2005 | Kurita et al. | .................. | 118/719 |
| 6,996,453 B2 * | 2/2006 | Ahn et al. | ..................... | 414/217 |
| 7,112,115 B1 * | 9/2006 | Yamazaki et al. | .............. | 445/25 |
| 7,416,574 B2 * | 8/2008 | Udagawa et al. | ............. | 454/187 |
| 7,561,937 B2 * | 7/2009 | Reed et al. | .................... | 700/109 |

(Continued)

FOREIGN PATENT DOCUMENTS

| | | | | | |
|---|---|---|---|---|---|
| DE | 39 08 329 A1 | * | 9/1990 | ............... | F24F 7/00 |
| JP | 5-299314 | * | 11/1993 | .................... | 414/939 |

*Primary Examiner* — James Keenan
(74) *Attorney, Agent, or Firm* — Slater & Matsil, L.L.P.

(57) ABSTRACT

A semiconductor manufacturing line includes an inert environment selected from the group consisting essentially of an inert airtight wafer holder, an inert wafer transport channel, an inert production tool, an inert clean room, and combinations thereof.

20 Claims, 3 Drawing Sheets

(56) References Cited

U.S. PATENT DOCUMENTS

| | | | |
|---|---|---|---|
| 7,699,573 B2* | 4/2010 | Blattner et al. | 414/217 |
| 7,753,049 B2* | 7/2010 | Jorczak et al. | 128/205.24 |
| 2001/0026747 A1* | 10/2001 | Saga | 414/200 |
| 2007/0258796 A1* | 11/2007 | Englhardt et al. | 414/217 |
| 2007/0269293 A1* | 11/2007 | Yu et al. | 414/217 |
| 2007/0278682 A1* | 12/2007 | Ko et al. | 257/758 |
| 2007/0287375 A1* | 12/2007 | Shuen | 454/187 |
| 2008/0096380 A1* | 4/2008 | Ko et al. | 438/622 |
| 2008/0221721 A1* | 9/2008 | Reed et al. | 700/109 |

\* cited by examiner

PREVENTING CONTAMINATION IN INTEGRATED CIRCUIT MANUFACTURING LINES

This application claims the benefit of U.S. Provisional Patent Application Ser. No. 60/933,344, filed on Jun. 6, 2007, and entitled "Preventing Contamination in Integrated circuit Manufacturing Lines," which application is incorporated herein by reference.

TECHNICAL FIELD

This invention relates generally to integrated circuits, and more particularly to the manufacturing processes and manufacturing lines of integrated circuits.

BACKGROUND

Existing integrated circuit (IC) manufacturing lines typically include large clean rooms and some manufacturing tools in the clean rooms, while other tools, such as metrologies and wafer transferring/transporting/exchanging paths, are within a relatively open environment. When exposed to the open environment, wafers are vulnerable to the attacks of adverse substances such as moisture, oxygen, and various airborne molecular contaminants (AMC) sources, which include etching byproduct solvents, perfumes, storage materials, chamber residual gases, etc. An example of the AMCs is dimethyl sulfide (DMS), which is a chemical commonly used in the semiconductor manufacturing processes.

As the semiconductor processes precede into the nanometer domain, the negative effects of AMCs on IC manufacturing become increasingly more severe. In some critical stages, AMCs have posted serious problems impacting either device performance or metrology accuracy. For example, in the formation of copper features in metallization layers, due to the very small size of copper features, the reaction caused by oxygen, moisture, and the AMC sources causes the increase in RC delay, and even the reduction in production yield. Low-k dielectric materials for forming metallization layers are also vulnerable to the attack of chemicals such as acids.

Existing IC manufacturing lines do not provide effective means for protecting wafers from the above-discussed problems. Some processing and transporting steps are not even protected by clean rooms. Further, even if some process steps are performed in clean rooms, the wafers are still exposed to some detrimental chemicals. For example, DMS molecules are small, and it is difficult to remove them from clean rooms. Furthermore, the clean room must include oxygen for operators to work in, and the operators themselves further introduce moisture. Therefore, methods have been explored to reduce the adverse substances. For example, efforts have been made to reduce the interval (Q time) between process stages. Cassettes or front opening unified pods (FOUP) were also periodically cleaned to remove possible adverse substances. However, these methods do not solve the root cause of the problem, and hence can only relieve, but not eliminate, the problem.

Accordingly, new tools and manufacturing methods are needed to prevent the damages caused by moisture, oxygen and AMC sources.

SUMMARY OF THE INVENTION

In accordance with one aspect of the present invention, a semiconductor manufacturing line includes an inert environment selected from the group consisting essentially of an inert airtight wafer holder, an inert wafer transport channel, an inert production tool, an inert clean room, and combinations thereof.

In accordance with another aspect of the present invention, a semiconductor manufacturing system includes an inert clean room filled with an inert gas selected from the group consisting essentially of nitrogen, helium, neon, argon, krypton, xenon, radon, and combinations thereof; and a production tool in the inert clean room.

In accordance with yet another aspect of the present invention, a semiconductor manufacturing system for manufacturing integrated circuit on a wafer is provided. The semiconductor manufacturing system includes a wafer holder for holding the wafer; a stocker for storing the wafer; a first production tool for processing the wafer; a second production tool for processing the wafer; and a wafer transport channel for transporting the wafer between the first and the second production tools, wherein a path comprising the wafer holder, the stocker, the first and the second production tools and the wafer transport channel is substantially inert.

In accordance with yet another aspect of the present invention, a method of forming integrated circuits on a wafer includes a step selected from the group consisting essentially of placing the wafer in an airtight wafer holder, transporting the wafer into a production tool, and transporting the wafer between production tools, and combinations thereof. The wafer holder has a first inert environment. The production tool has a second inert environment. The wafer is exposed only to a third inert environment during the step of transporting the wafer between the production tools.

In accordance with yet another aspect of the present invention, a method of forming integrated circuits on a wafer includes performing a first integrated circuit manufacturing step using a first production tool; performing a second integrated circuit manufacturing step using a second production tool, wherein the first and the second production tools are physically detached; and transferring the wafer between the first and the second production tools, wherein the wafer is exposed substantially only to an inert environment during the step of transferring.

The advantageous features of the present invention include reduced exposure of wafers to detrimental substances during integrated circuit manufacturing processes. The yield and performance are thus improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
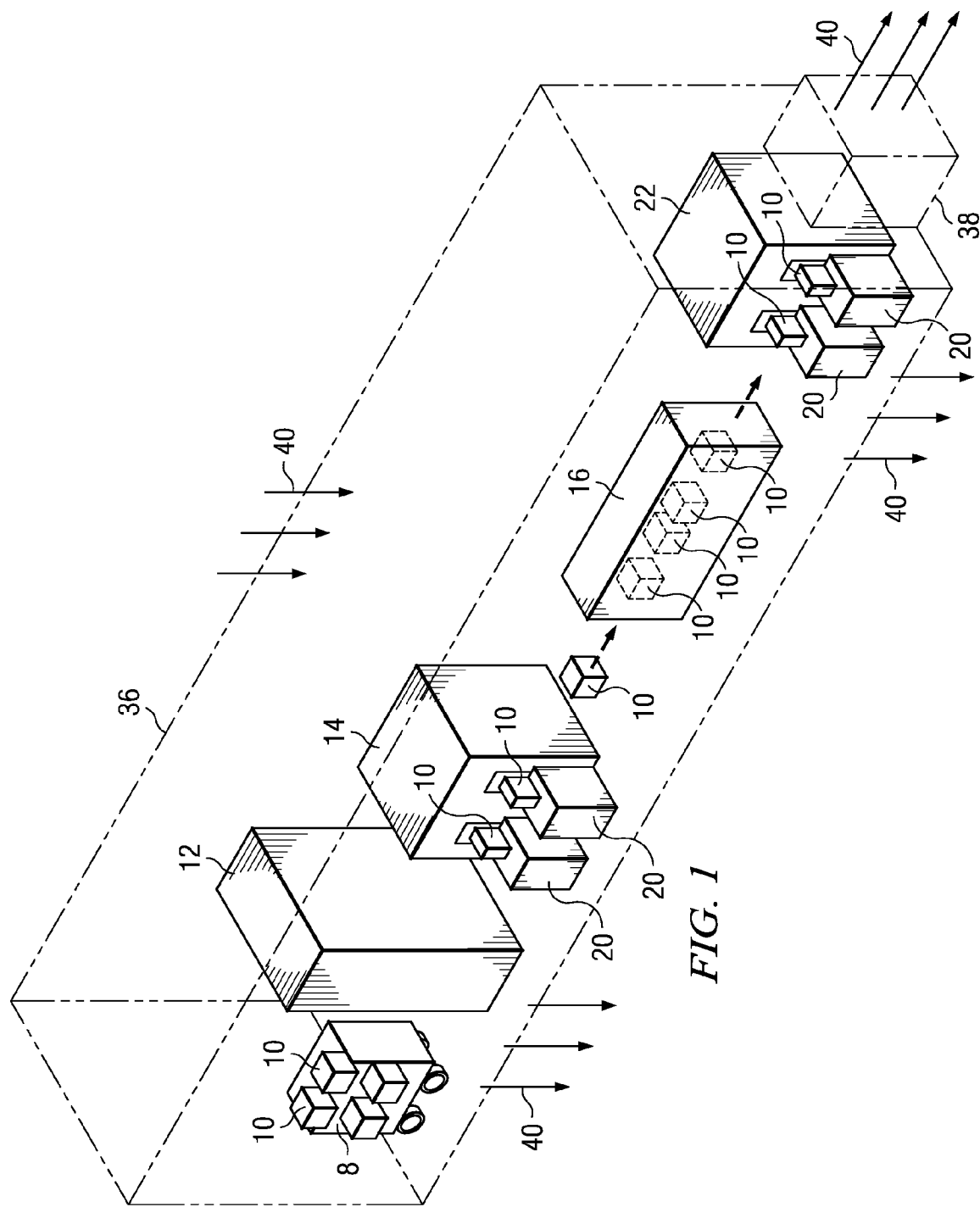
FIG. 1 illustrates a clean room including trolleys, production tools, stockers, and a wafer transport channel.

FIG. 1 illustrates an exemplary manufacturing line, which includes trolley 8, stocker 12, production tools 14 and 22, and wafer transport channel 16. Trolley 8 and wafer transport channel 16 are used to transport wafer holders 10, which may be cassettes or front opening unified pods (FOUP).

In the manufacturing processes, wafers need to go through one or more of the above-discussed tools. For example, wafer holders 10 may be transported by trolley 8 into stocker 12, which has a large wafer storage for storing wafers. Wafers holders 10 may also be transported to loadlocks 20, which load wafers into and take wafers out of production tool 14. Production tool 14, which may be any of the chemical vapor deposition tools, sputtering tools, and the like, performs manufacturing steps to the wafers. Wafer holders 10 are then transported to the next production tool 22, and the next manufacturing step is performed. The transportation between production tools 14 and 22 may be performed using trolleys or automatic wafer transport channel 16.

In FIG. 1, one or more, and preferably all of the above-discussed tools are either in an inert environment, or have inert environments themselves. Throughout the description, the term "inert environment" refers to either a vacuum environment, for example, with a pressure of less than 760 torr, and more preferably less than about 1 torr, or an environment filled substantially with inert gases. The inert gas filled environment may include a small percentage of other gases, such as clean air. In an exemplary embodiment, in an inert gas-filling environment, the partial pressure of the inert gases is preferably greater than about 10 percent, and more preferably greater than about 90 percent of the total gas pressure. The inert gases include gases difficult to react with the materials of semiconductor wafers and structures formed thereon, and may include nitrogen, helium, neon, argon, krypton, xenon, radon, and combinations thereof. More preferably, the environment filled with the inert gases is preferably airtight. Even more preferably, the inert gases in the airtight environment have a positive pressure greater than about one atmosphere so that the leakage, if any, will be in an outward direction. In the inert environments, the wafers and the integrated circuit structures formed thereon are substantially free from the adverse reaction with undesirable substances.

Figure 2:
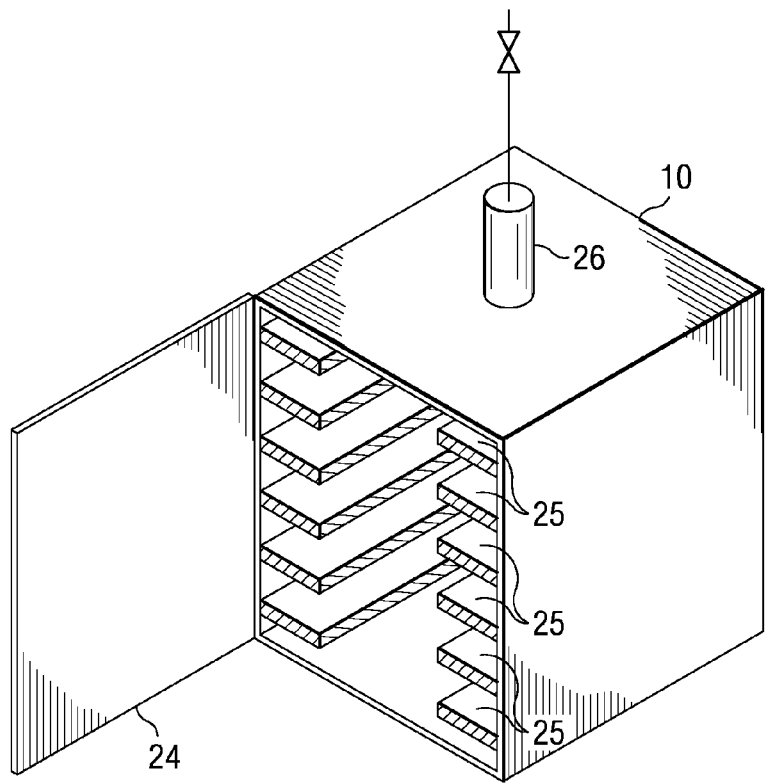
FIG. 2 illustrates an exemplary inert cassette.

FIG. 2 schematically illustrates wafer holder 10, which may be a wafer cassette or a front opening unified pod (FOUP). Wafer holder 10 includes a plurality of racks 25, each for holding one wafer. Wafer holder 10 is preferably airtight, which may be achieved by sealing the gaps between door 24 and the body. One skilled in the art will realize the corresponding materials and mechanisms. After door 24 is closed, wafer holder 10 maintains the inner pressure. In a first embodiment, wafer holder 10 is suitable for maintaining a positive pressure greater than about one atmosphere. Preferably, inert gases are pumped into wafer holder 10 after door 24 is closed. Advantageously, the positive pressure in wafer holder 10 prevents undesirable substances, such as water, oxygen, airborne molecular contaminants (AMC), and the like, from leaking in. Accordingly, wafer holder 10 may include an inlet 26 for pumping inert gases into wafer holder 10. In a second embodiment, wafer holder 10 is suitable for maintaining a negative pressure (vacuum). Accordingly, an outlet (also illustrated as 26) is used for pumping air out.

Similarly, stocker 12 (refer to FIG. 1) is also airtight, and can either be filled with inert gases, or vacuumed. Preferably, if stocker 12 is filled with inert gases, the pressure inside stocker 12 is also greater than about one atmosphere. Stocker 12 may be used to store wafers directly, or store wafer holders 10. Stocker 12 may further include an inlet port and an outlet port (not shown), and thus inert gases can be recycled. Further, stocker 12 may include an interface (not shown) for storing/retrieving wafers and/or wafer holders.

Figure 3:
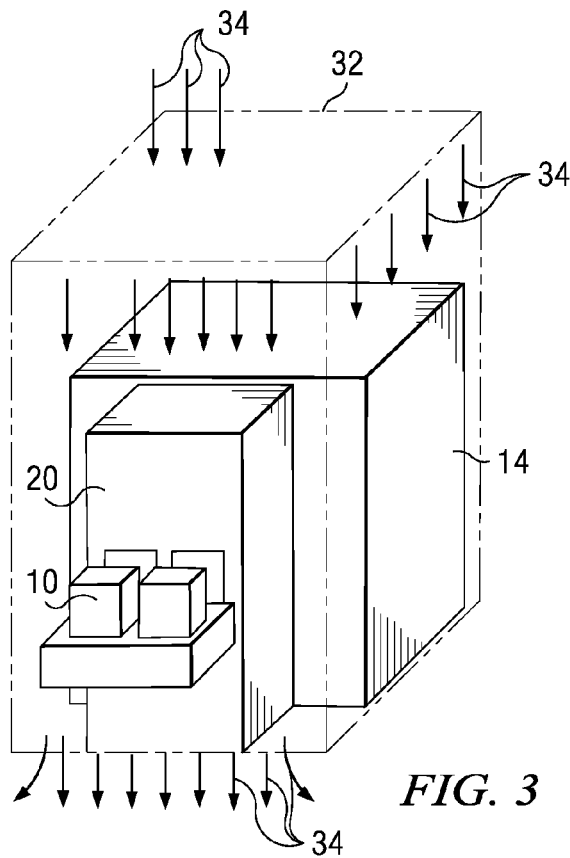
FIG. 3 illustrates a production tool, wherein a loadlock is used to load wafers into the production tool, during which the wafers are transferred in an inert environment.

FIG. 3 illustrates an ambient-controlled production tool 14, which includes loadlock 20 for transporting wafers into and out of production tool 14. In an embodiment, loadlock 20 provides an airtight environment for opening wafer holder 10, and transporting wafers into production tool 14 in the airtight environment. Again, the airtight environment is preferably an inert environment, which may be filled with inert gases, or vacuumed. During the process of transferring wafers between wafer holder 10, and the process of transferring wafers between loadlock 20 and production tool 14, the wafers are substantially free from being exposed to external environments. Alternatively, loadlock 20 and production tool 14 are placed in an inert environment, as is symbolized by frame 32. Arrows 34 symbolize inert gases flowing into and out of the inert environment. The inert environment for accommodating loadlock 20 and production tool 14 may be a miniature clean room, or a full-fledged clean room, as will be discussed in detailed in subsequent paragraphs.

Figure 4:
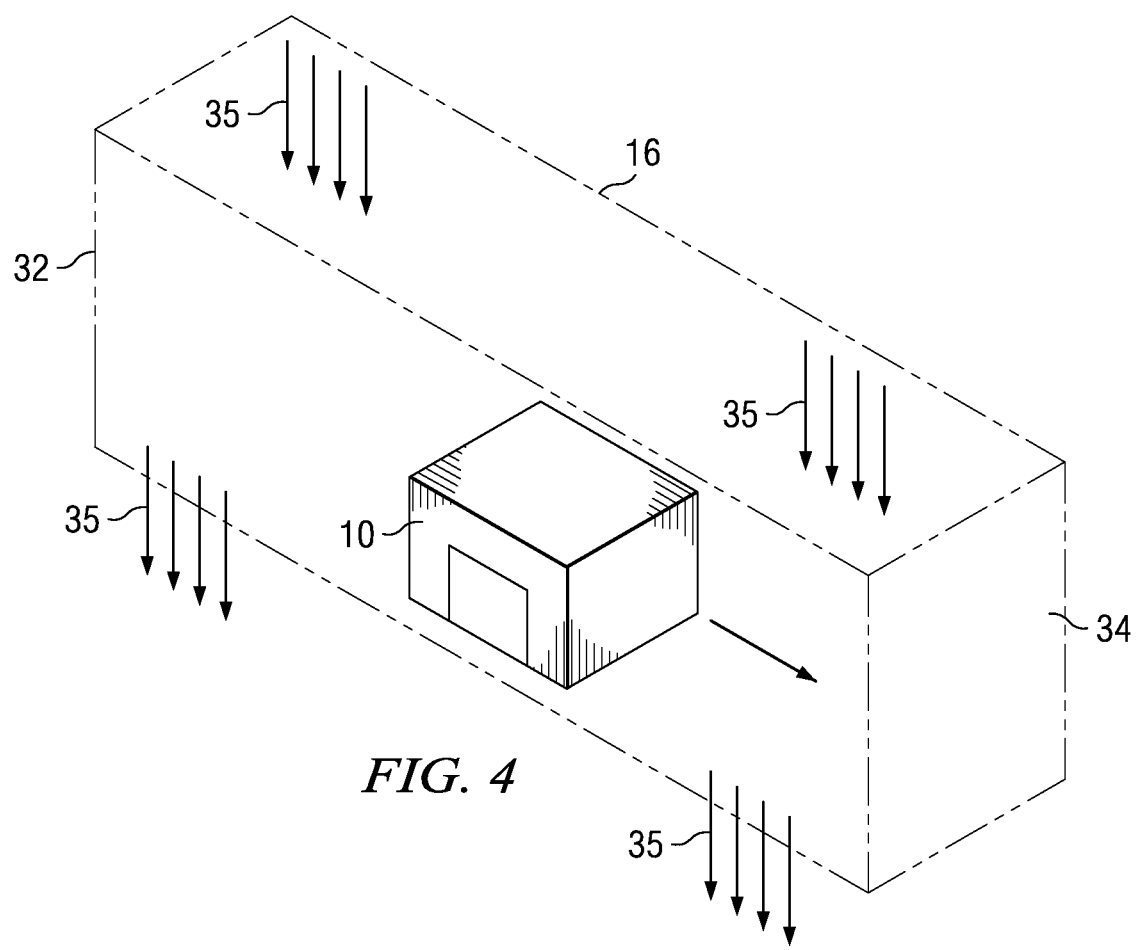
FIG. 4 schematically illustrates an inert wafer transport channel.

FIG. 4 schematically illustrates the inert wafer transport channel 16, which may be used to transport wafers between production tools 14 and 22 (refer to FIG. 1). Wafer transport channel 16 may include a vehicle (not shown) traveling on a track (not shown), and wafer holder 10 may be transported by the vehicle. An exemplary vehicle and track may be the well-known overhead hoist transport (OHT). In an embodiment, the wafers are transported using wafer holder 10 and transported using trolleys. In alternative embodiments, wafers are transported without being placed in wafer holder 10. In an exemplary embodiment, wafer transport channel 16 is filled with inert gases, which are preferably introduced into wafer transport channel 16 from the top, and evacuated from the bottom, as is illustrate by arrows 35. The inert gases may be recycled. Alternatively, wafer transport channel 16 is a sealed system that can be vacuumed. In this case, interfaces 32 and 34 are provided for loading wafer holders 10 into and out of wafer transport channel 16. For example, interfaces 32 and 34 are each connected with a loadlock, so that wafer holders 10 are not exposed to open air during the transportation between production tool 14 and wafer transport channel 16.

To effectively isolate wafers from external detrimental substances (for example, in the open air), an entire clean room may be constructed as an inert environment, as is shown in FIG. 1. Currently, clean rooms are filled with clean air. However, it is either infeasible, or very difficult to remove oxygen, moisture and/or certain AMCs such as DMS from the clean rooms. It is thus advantageous to build inert clean rooms, which is either filled with inert gases, or vacuumed. If vacuumed, the inert clean rooms need to be airtight.

In a first embodiment, as is shown in FIG. 3, an inert clean room is a miniature environment accommodating only one production tool. Alternatively, the inert clean room may accommodate more than one production tools, and may even accommodate stockers, wafer transport channels, trolleys, and the combinations thereof. An exemplary inert clean room with such an ability is symbolized by frame 36 in FIG. 1.

Inert clean room 36 preferably includes factory interfaces and/or gateways 38 for materials and operators going into and out of inert clean room 36. Accordingly, factory interfaces 38 needs to be covered by the flow of inert gases, wherein a flow is preferably out of the factory interfaces and/or gateways 38, as is shown as arrows 40. It is realized that inert room 36 is not suitable for operators, and special equipment is needed for the operators to access.

Preferably, the entire wafer manufacturing process, for example, starting from the step of forming gate dielectrics to the fabrication of the passivation layers and bonding pads on the wafers, are performed in inert environments. Inert storage environments, inert transporting environments, and inert production environments are thus preferably combined to prevent wafers from being exposed to external environment (for example, atmosphere). One skilled in the art will realize that not all of the previously discussed inert environments are needed simultaneously. For example, if a large inert clean room is adopted, then the wafer storage, wafer transporting and production tools inside the inert clean room do not need to have their individual inert environments. Alternatively, if wafer storage, wafer transporting and production tools form a continuous inert environment, then the large inert clean room is not necessary. In this case, the interfaces between the inert environments of wafer storage, wafer transporting and production tools need to be designed to prevent the wafer from being exposed to atmosphere.

Alternatively, wafer production processes are evaluated to determine which of the intermediate integrated circuit structures are more vulnerable to detrimental substances, and only the vulnerable structures are protected by inert environments, while other intermediate integrated circuit structures are formed and transported in ordinary clean rooms that are not inert. For example, the formations of copper interconnections and extreme low-k dielectric layers are preferably protected from DMS and moisture, respectively. The optimum combination regarding which intermediate structures and equipments need inert environments may be determined by how effective the inert simultaneously can protect the respective intermediate integrated circuit structures, and the cost.

The embodiments of the present invention have several advantageous features. The oxidation, reaction with AMCs, and moisture attacks to the intermediate integrated circuit structures are reduced, and possibly substantially eliminated, and hence the adverse process, and variations in device performance and yield are reduced. Leading edge technologies, which are more vulnerable to the attacks of the detrimental substances in the air, can thus be performed with less concern. Furthermore, with the adoption of the embodiments of the present invention, less process steps, process tools, metrologies and redundant monitoring are needed. For example, the commonly performed cleaning processes for removing native oxides and contaminates on surfaces of metal feature may be skipped. This results in the increased productivity and reduced production cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor manufacturing line comprising:
an inert clean room containing an inert environment;
a first production tool contained in the inert clean room and the inert environment, the first production tool containing a first tool environment, the first production tool including a first load lock, the first load lock containing a first load lock environment separate from the first tool environment, the first load lock environment being between the inert environment in the inert clean room and the first tool environment;
a second production tool contained in the inert clean room and the inert environment, the second production tool containing a second tool environment, the second production tool including a second load lock, the second load lock containing a second load lock environment separate from the second tool environment, the second load lock environment being between the inert environment in the inert clean room and the second tool environment; and
an interface environment unit between the inert environment in the inert clean room and an external environment, wherein the interface environment unit includes a first inert gas having an inner pressure greater than an external pressure of the external environment.

2. The semiconductor manufacturing line of claim 1, wherein the inert environment in the clean room is filled substantially with a second inert gas.

3. The semiconductor manufacturing line of claim 1, wherein the inert environment is substantially only a second inert gas, wherein the second inert gas is selected from the group consisting essentially of krypton, xenon, radon, and a combination thereof.

4. The semiconductor manufacturing line of claim 1, wherein the inert environment has a pressure of greater than one atmosphere.

5. The semiconductor manufacturing line of claim 1, wherein the inert environment is a vacuum environment.

6. The semiconductor manufacturing line of claim 1, wherein at least one of the first load lock environment and the second load lock environment is a load lock inert environment.

7. The semiconductor manufacturing line of claim 6, wherein the load lock inert environment is filled substantially with a second inert gas.

8. The semiconductor manufacturing line of claim 6, wherein the load lock inert environment has a pressure of greater than one atmosphere.

9. The semiconductor manufacturing line of claim 6, wherein the load lock inert environment is a vacuum environment.

10. The semiconductor manufacturing line of claim 1 further comprising a wafer transport channel for transporting wafers between the first production tool and the second production tool, the wafer transport channel being contained in the inert clean room and the inert environment.

11. The semiconductor manufacturing line of claim 10, wherein the wafer transport channel contains a channel inert environment, the channel inert environment being substantially only a second inert gas.

12. The semiconductor manufacturing line of claim 10, wherein the wafer transport channel contains a channel inert environment, the channel inert environment having a pressure of greater than one atmosphere.

13. The semiconductor manufacturing line of claim 10, wherein the wafer transport channel contains a channel inert environment, the channel inert environment being a vacuum environment.

14. The semiconductor manufacturing line of claim 1 further comprising a stocker configured to store a wafer, the stocker being contained in the inert clean room and the inert environment, the stocker containing a stocker inert environment in which the stocker is configured to store the wafer.

15. The semiconductor manufacturing line of claim 1, wherein the interface environment unit comprises a gateway interfacing to the inert clean room.

16. A semiconductor manufacturing line comprising:
an inert clean room containing an inert environment;
a first production tool contained in the inert clean room and the inert environment, the first production tool containing a first tool environment, the first production tool including a first load lock, the first load lock containing a first load lock environment separate from the first tool environment, the first load lock environment being between the inert environment in the inert clean room and the first tool environment;
a second production tool contained in the inert clean room and the inert environment, the second production tool containing a second tool environment, the second production tool including a second load lock, the second load lock containing a second load lock environment separate from the second tool environment, the second load lock environment being between the inert environment in the inert clean room and the second tool environment;
a holder contained in the inert clean room and the inert environment, each of the first load lock and the second load lock being configured to receive a wafer from the holder; and
an interface environment unit between the inert environment in the inert clean room and an external environment, wherein the interface environment unit includes a first inert gas having an inner pressure greater than an external pressure of the external environment.

17. The semiconductor manufacturing line of claim 16, wherein the holder contains a holder inert environment, the holder inert environment being substantially only a second inert gas.

18. The semiconductor manufacturing line of claim 16, wherein the holder contains a holder inert environment, the holder inert environment having a pressure of greater than one atmosphere.

19. The semiconductor manufacturing line of claim 16, wherein the holder contains a holder inert environment, the holder inert environment being a vacuum environment.

20. A semiconductor manufacturing line comprising:
an inert clean room containing an inert environment;
a first production tool contained in the inert clean room and the inert environment, the first production tool containing a first tool environment, the first production tool including a first load lock, the first load lock containing a first load lock inert environment separate from the first tool environment, the first load lock inert environment being between the inert environment in the inert clean room and the first tool environment;
a second production tool contained in the inert clean room and the inert environment, the second production tool containing a second tool environment, the second production tool including a second load lock, the second load lock containing a second load lock inert environment separate from the second tool environment, the second load lock environment being between the inert environment in the inert clean room and the second tool environment;
a holder configured to hold a wafer, the holder containing a holder inert environment in which the holder is configured to hold the wafer, the first load lock and the second load lock being configured to interface with the holder to pass the wafer to and from the holder;
a wafer transport channel configured to transport the holder between the first production tool and the second production tool, the wafer transport channel being contained in the inert clean room and the inert environment, the wafer transport channel containing a channel inert environment in which the wafer transport channel is configured to transport the holder; and
an interface environment unit between the inert environment in the inert clean room and an external environment, wherein the interface environment unit includes a first inert gas having an inner pressure greater than an external pressure of the external environment.

* * * * *